United States Patent [19]

Tanada

[11] 4,191,850
[45] Mar. 4, 1980

[54] INTERFERENCES REDUCTION FOR USE IN AN FM RADIO RECEIVER

[75] Inventor: Eiji Tanada, Higashihiroshima, Japan

[73] Assignee: Sharp Kabushiki Kaisha, Osaka, Japan

[21] Appl. No.: 916,353

[22] Filed: Jun. 16, 1978

[30] Foreign Application Priority Data

Jun. 17, 1977 [JP] Japan ................................. 52-72545
Aug. 18, 1977 [JP] Japan ................................. 52-99250

[51] Int. Cl.$^2$ .............................................. H04H 5/00
[52] U.S. Cl. ................................................. 179/1 GD
[58] Field of Search ........................ 179/1 GD, 1 GE; 325/478, 36, 402, 403

[56] References Cited

U.S. PATENT DOCUMENTS 3,739,285  6/1973  Hepp ................................. 179/1 GD
3,919,482  11/1975  Hamada ........................... 179/1 GD
4,066,845  1/1978  Kishi ................................. 179/15 BT Primary Examiner—Douglas W. Olms
Attorney, Agent, or Firm—Birch, Stewart, Kolasch & Birch

[57] ABSTRACT

Information signals, 19 KHz stereo pilot signals and interference signals are received at an antenna and then applied to a low-pass filter and a high-pass filter. The interference signals derived from the high-pass filter control a gate which is disposed in a circuit path including the low-pass filter, a subcarrier generator and an FM multiplexer for the interference reduction purposes. A trap filter is provided between the antenna and the FM multiplexer for arresting the 19 KHz stereo pilot signals, while the signals derived from the low-pass filter are introduced into the above mentioned circuit path.

6 Claims, 4 Drawing Figures

INTERFERENCES REDUCTION FOR USE IN AN FM RADIO RECEIVER

BACKGROUND OF THE INVENTION

The present invention relates to an interference reduction circuit arrangement for use in an FM stereo receiver.

A well known technique for interference reduction in FM stereo receiver disign is disclosed and illustrated in U.S. Pat. No. 3,739,285, "CIRCUIT ARRANGEMENT FOR SUPPRESSING INTERFERENCES IN AN FM RADIO RECEIVER" assigned to U.S. Philip Corporation. According to this technique, a gate circuit is provided which is blocked upon the occurrence of impulsive interference signals and a resonant circuit with the pilot frequency is provided in parallel.

With such an arrangement, FM reception signals derived from the gate circuit are free of the impulsive interference signals. Should the pulse width of the impulsive interference signals be longer, the gate circuit will remain blocked longer, removing the information signals and the 19 KHz stereo pilot signals developed at that period. Even if the information signals are removed with the gate circuit to some extent, this will not present any adverse effect in listening to music. The absence of the 19 KHz pilot signals, however, is not desirable to FM reception. To this end the 19 KHz resonant circuit is provided between the gate circuit and a buffer amplifier to form a pseudo 19 KHz pilot signal. The FM reception signals are applied to a 38 KHz subcarrier generator and an FM multiplexer through the buffer amplifier and a conventional amplifier, while the output of the subcarrier generator is applied to the FM multiplexer.

Though the interference reduction circuit offers satisfactory performances in a sense to suppress impulsive interference signals, the true 19 KHz stereo pilot signals disappear together with the interference. If the pseudo 19 KHz signal from the resonant circuit is not completely in agreement with the 19 KHz pilot signal received at the antenna, then secondary interference signals will happen by the on and off operation of the gate circuit.

Accordingly, the 19 KHz signal from the resonant circuit needs extremely severe adjustment. The resonant circuit of good Q value is expensive and a Q value adjustment circuit is additionally required. The Q value of the resonant circuit will vary more or less from its initial value for long use of an FM receiver.

SUMMARY OF THE INVENTION

It is therefore an object of the present invention to provide a powerful interference reduction circuit which overcomes the above discussed fatal shortcoming with the prior art. The present invention makes it possible to remove interference signals during FM signal reception in a manner that the 19 KHz stereo pilot signals surely are supplied to the subcarrier generator despite the on and off performances of a gate circuit.

According to the present invention, there is provided a gate circuit responsive to interference signals and disposed in a circuit including an FM multiplexer and a subcarrier generator. A 19 KHz stereo pilot signal trap filter is disposed in a circuit path from an antenna through the FM multiplexer, preferrably in front of the gate circuit, for removing the pilot signal. Meanwhile, the information signals and the pilot signals are supplied to the circuit including the FM multiplexer and the subcarrier generator without passing through the gate circuit.

In one preferred aspect of the present invention, the information signal, the 19 KHz stereo pilot signals and the interference signals are received at an antenna and then applied to a low-pass filter and a high-pass filter. The interference signals derived from the high-pass filter control a gate which is disposed in a circuit path including the low-pass filter, a subcarrier generator and an FM multiplexer 18 for the interference reduction purposes. A trap filter is provided between the antenna and the FM multiplixer for arresting the 19 KHz stereo pilot signals, while the signals derived from the low-pass filter are introduced into the above mentioned circuit path. In addition, it is desirable to adjust the degree of attenuation of the 19 KHz stereo pilot signals in the trap filter.

In another preferred aspect of the present invention, a band-pass filter if provided for the 19 KHz stereo pilot signals in parallel with the 19 KHz trap filter and the gate circuit.

BRIEF DESCRIPTION OF THE DRAWINGS

Other objects and many of the attendant advantages of the present invention will be easily appreciated as the same becomes better understood by reference to the following detailed description which considered in conjunction with the accompanying drawings in which like reference numerals designate like parts throughout the figures thereof, and wherein.

DETAILED DESCRIPTION OF THE INVENTION

Figure 1:
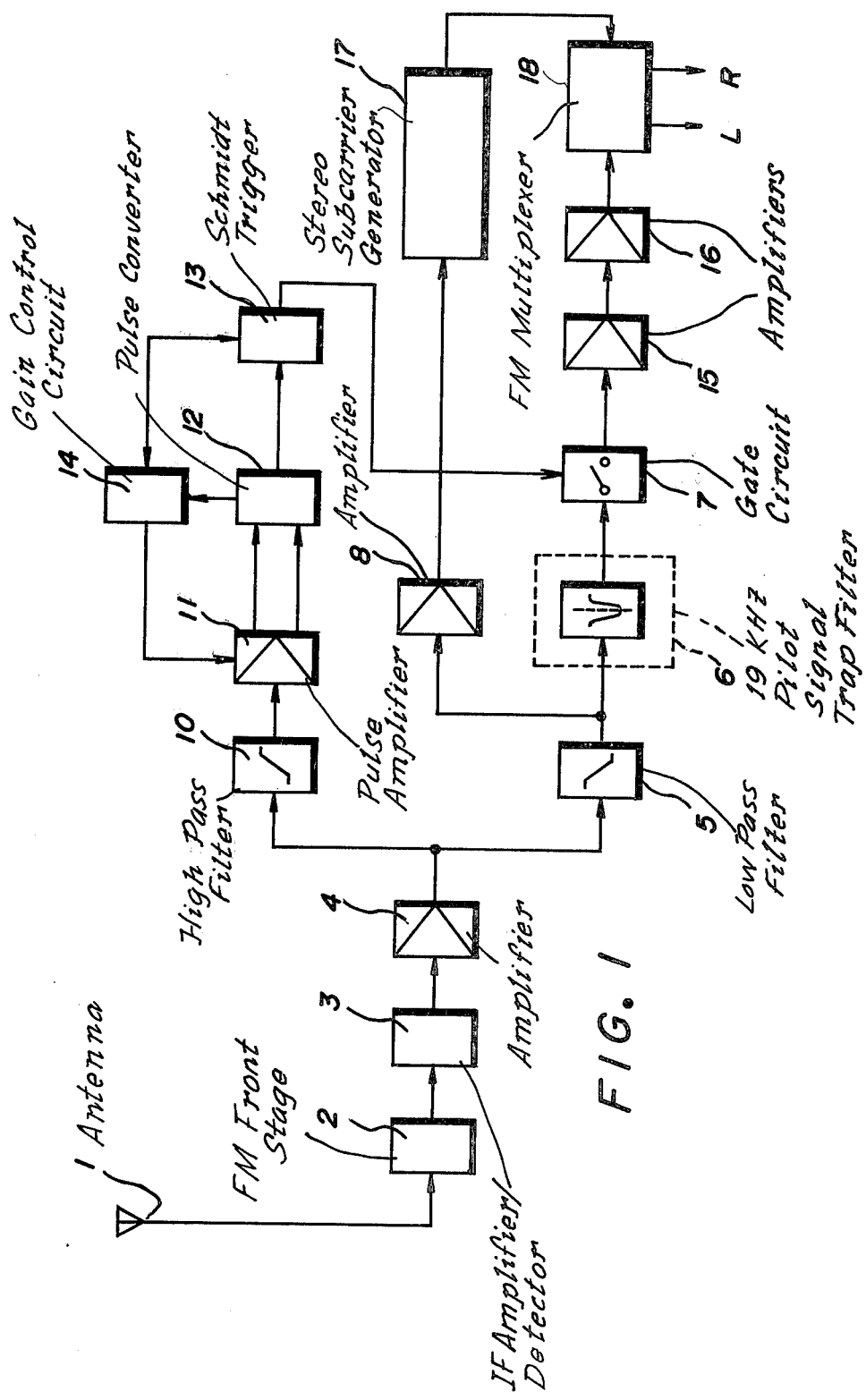
FIG. 1 is a block diagram of one embodiment of the present invention.

Referring now to FIG. 1, there is illustrated one embodiment of the present invention. Composite signals consisting of information signals, 19 KHz stereo pilot signals and sporadic interference signals are received at an FM antenna 1 and derived from an IF amplifier/detector 3 after passing through an FM front stage 2. The output of the FM detector 3 is applied both to a low-pass filter 5 and a high-pass filter 10 via an amplifier 4. The sporadic interference signals are taken out of the composite signals applied to the high-pass filter 10 and subsequently supplied to a pulse amplifier 11. The output of the amplifier 11 is sent to a pulse converter 12, which converts the sporadic interference signals with the negative component into the counterpart with the positive component. The interference signals from the pulse converter 12 are supplied to a schmitt trigger 13, which in turn provides a positive polarity control signal for a gate 7 and a negative polarity control signal for a gain control circuit 14. The gain control circuit 14 develops a signal effective to control the gain of the pulse amplifier 11.

At the output of the low-pass filter 5 there is developed the information signals, the 19 KHz stereo pilot signal, and the interference signals which are not removed with the low-pass filter 5.

Unlike the above discussed prior art, the output of the low-pass filter 5 is applied to an amplifier 8 and a 19 KHz stereo pilot signal trap filter 6 which plays a key role in the present invention. Therefore, the 19 KHz stereo pilot signals are removed via the trap filter 6 from the signals applied thereto. The remaining information signals and the interference signals are supplied to the gate circut 7. When the interference signals energize the gate circuit 7, the gate circuit 7 is enabled with the output of the trigger 13, thereby removing the interference signals and supplying only the information signals and the pilot signals to an FM multiplexer 18 via a pair of amplifiers 15 and 16. The output of the amplifier 8 is applied to a stereo subcarrier generator 17, developing a signal component of the subcarrier frequency 38 KHz which is to be supplied to the FM multiplexer 18.

Figure 2:
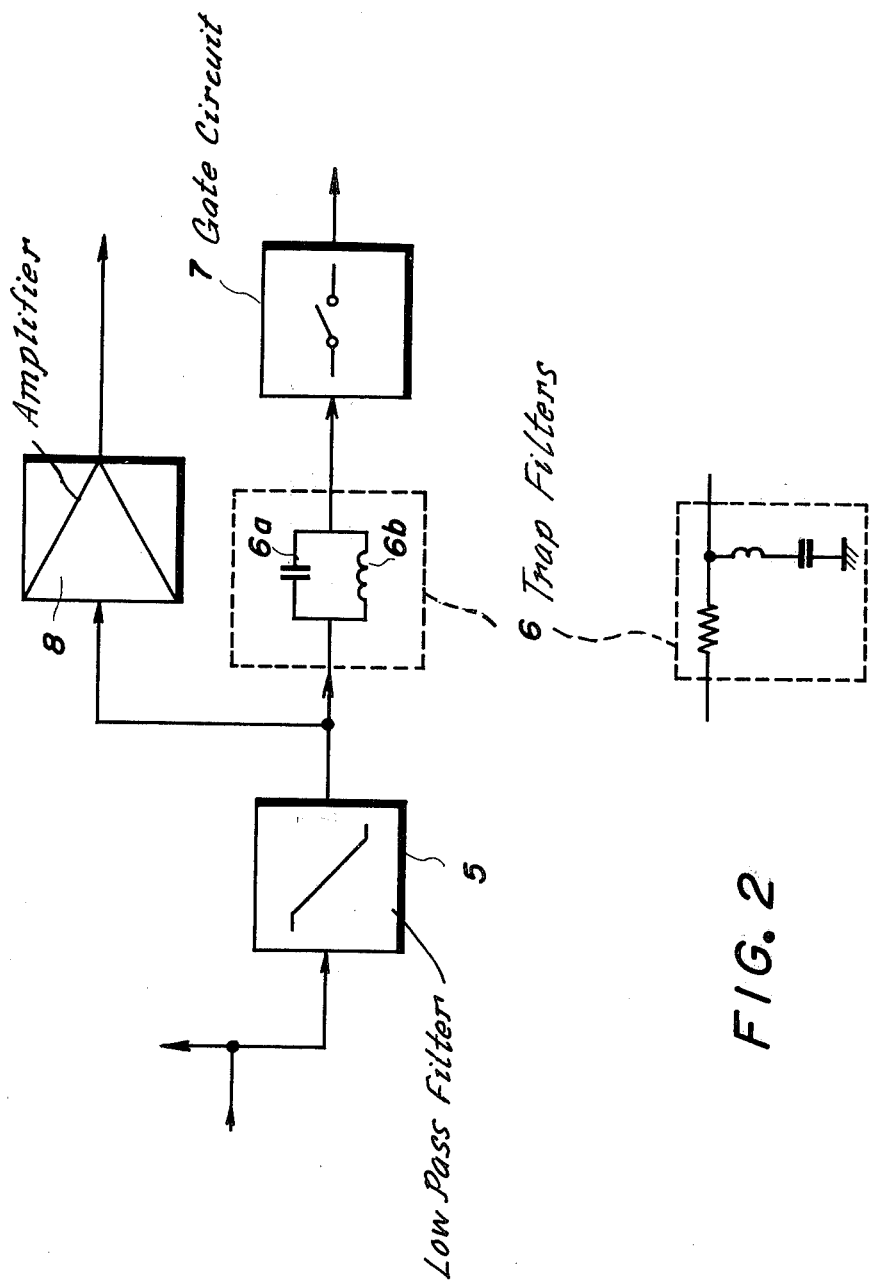
FIG. 2 is a circuit diagram of a trap filter used with the arrangement shown in FIG. 1.
Figure 3:
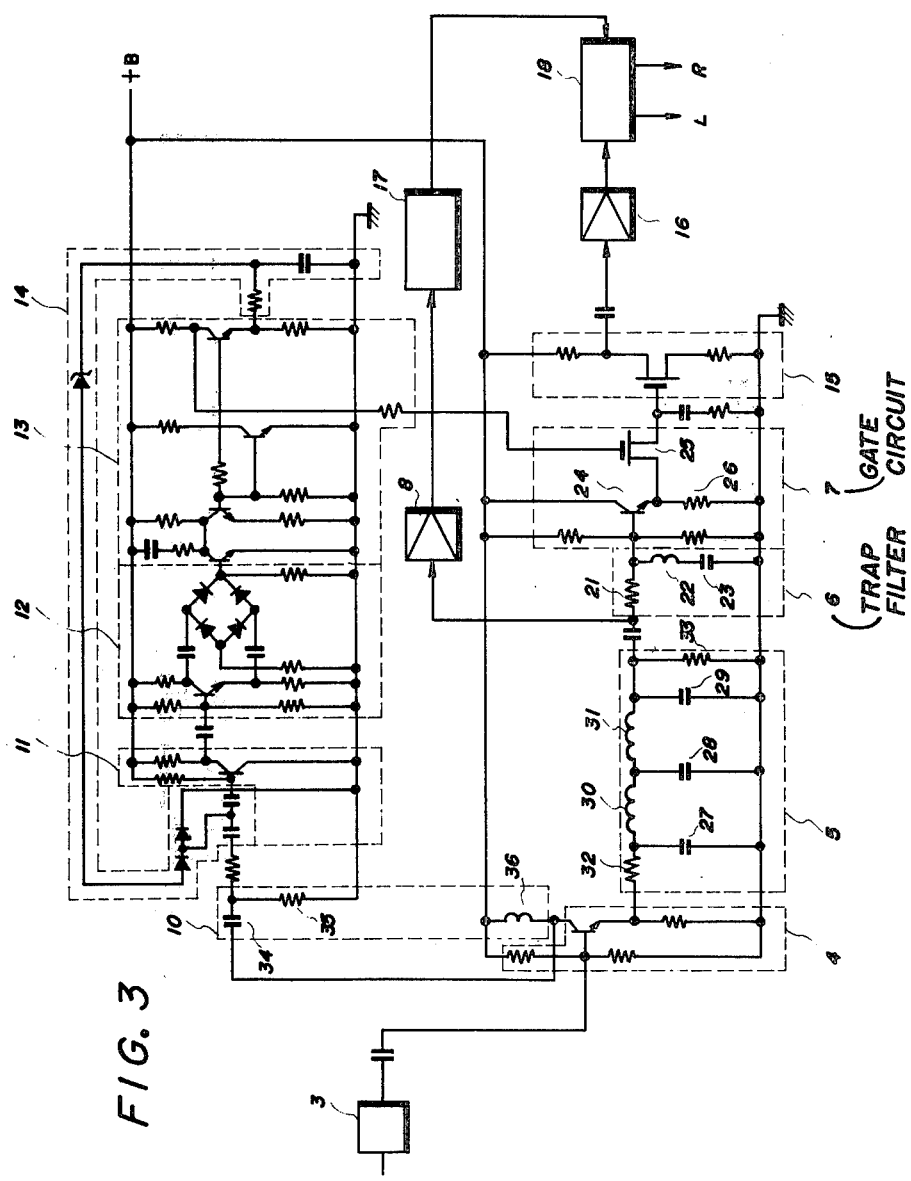
FIG. 3 is a detailed circuit diagram of the embodiment of FIGS. 1 and 2.

As seen from FIGS. 2 and 3 the trap filter 6 includes a resistor 21, a coil 22 and a capacitor 23 wherein only the 19 KHz stereo pilot signal is removed with the capacitor 23 and the coil 22 out of the information signals, the interference signals and the pilot signals passing through the low-pass filter 5. The gate circuit 7 comprises a bipolar transistor 24, a field effect mode transistor 25 and a resistor 26 disposed at the junction of the transistors 24 and 25. The field effect mode transistor 25 receives at the gate electrode the output of the schmitt trigger 13. The low-pass filter 5 is implemented with a predetermined number of capacitors 27, 28 29 and a predetermined number of coils 30, 31 and resistors 32, 33 in a well known manner. The high-pass filter 10, on the other hand, may be implemented with a capacitor 34, a resistor 35 and a coil 36. It will be noted that the cut off frequency of the low-pass filter 5 is clearly different from the counterpart of the high-pass filter 10: less than 53 KHz of the former and more than 97 KHz of the latter, for example.

Satisfactory results were obtained with 1.2 kΩ of the resistor 21; 8.56 mH of the coil 22; 0.0082 $\mu$F of the capacitor 23; 0.0022 $\mu$F of the capacitor 27; 0.0047 $\mu$F of the capacitor 28; 0.0022 $\mu$F of the capacitor 29; 1.2 mH of the coil 30; 2.4 mH of the coil 31; 330Ω of the resistor 32; 100kΩ of the resistor 33; 100pF of the capacitor 34; 22 kΩ of the resistor 35; and 1.2 mH of the coil 36.

Figure 4:
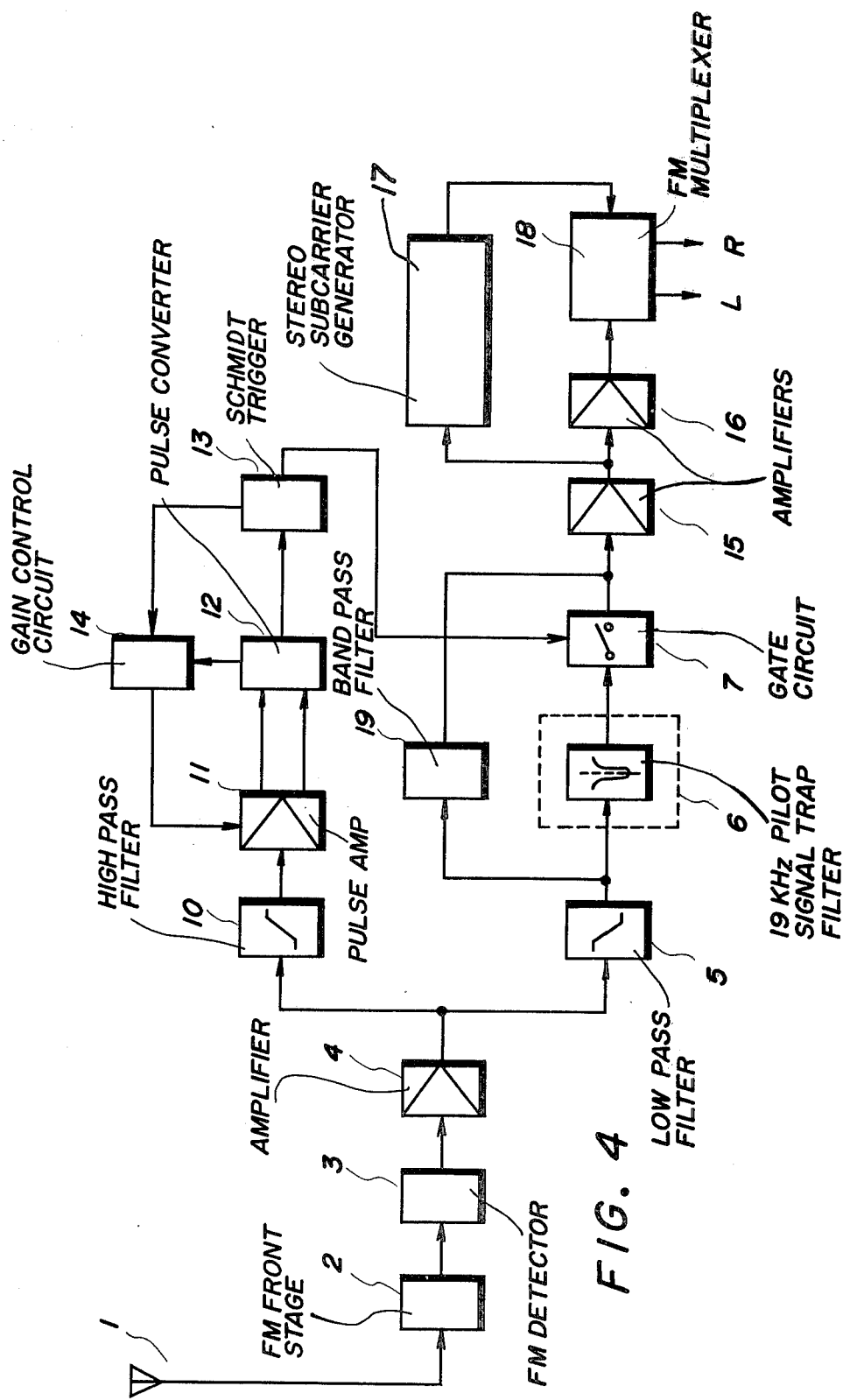
FIG. 4 is a block diagram of another embodiment of the present invention.

FIG. 4 illustrates another embodiment of the present invention wherein the information signals and the stereo pilot signal of 19 KHz passing through the low-pass filter 5 are applied to the 19 KHz trap filter 6 and to a band-pass filter 19 effective only to the 19 KHz stereo pilot signal. The output of the band-pass filter 19 is connected to the output side of the gate circuit 7. This modification also can utilize the very 19 KHz stereo pilot signals which are received at the antenna 1, eliminating the necessity for the bothersome adjustment in the amplitude of the 19 KHz signal as required in the prior art.

It is apparent to those skilled in the art that the trap filter 6 can be also disposed between the FM detector 3 and the amplifier 8. In this instance the amplifier 8 is adapted to receive the input from the junction of the trap filter 6 and the FM detector 3.

In addition, the trap filter 6 may be adapted not to remove the 19 KHz stereo pilot signal completely while keeping a considerable difference between the degree of attenuation of the 19 KHz signals and that of the composite signals, typically approximately 10 dB. This is because it is possible for the subcarrier generator 17 to establish the 38 KHz signals even when there is a difference of approximately 10 dB as compared with the composite signals.

As noted above, the present invention makes it possible to remove or minimize interference signals without any adverse effect of the 19 KHZ pilot signals.

Unlike the prior art interference reduction circuit which needs adjustment of the compensation of the re-established 19 KHZ stereo pilot signals and, upon failure thereof, presents the interference problem again, the present invention eliminates the necessity for such troublesome adjustments.

Moreover, according to the prior art interference reduction circuit arrangement, the period for re-establishment of the 19 KH stereo pilot signals is decided simply by such factors as inductance L of the coil, capacitance C of the capacitor and quality factor Q of the resonant circuit and thus kept 0 at all times. Therefore, the effects of the thus re-established 19 KHZ pilot signals will become too strong before the closed period of the gate circuit (7) reaches a desired one in the case where interference signals mingle with weak inputs. In contrast with the prior art, the circuit arrangement of the present invention does not allow the 19 KHZ stereo pilot signal to pass through the gate circuit (7) such as to supress the above mentioned problem with the prior art. Since the 19 KHZ stereo pilot signals are not supplied to a sound circuit path of the FM multiplexer according to the present invention, this not only minimizes remarkably the signal component with 19 KHZ which leaks out from the output side of the FM multiplexing demodulator but also supress secondary interferences (interferences with the stereo pilot signals, the noises and the stereo subcarrier signals) when the S/N ratio of the input of the multiplexing demodulator is not better. This leads to a remarkable improvement in S/N ratio of the output of the multiplexing demodulator.

The invention being thus described, it will be obvious that the same may be varied in many ways. Such variations are not to be regarded as a departure from the spirit and scope of the invention, and all such modifications are intended to be included within the scope of the following claims.

I claim:

1. An interference reduction circuit in an FM receiver wherein composite signals derived from an antenna of said receiver include information signals, FM pilot signals and interference signals, said circuit comprising:
   first and second signal transmission paths which terminate at an FM multiplexer adjacent to the receiver output;
   gate circuit means disposed in said first signal transmission path in series with said FM multiplexer for blocking said interference signals;
   subcarrier generator means disposed in said second signal transmission path in series with said FM multiplexer;
   pilot signal trap filter means disposed in said first signal transmission path in series with said gate circuit means and said FM multiplexer for attenuating said pilot signals in said first signal transmission path; and
   control means coupled to said gate circuit means, said control means sensing the presence of interference signals and blocking the passage of said interference signals through said gate circuit means in response thereto.

2. An interference reduction circuit in accordance with claim 1 wherein low pass filter means is disposed in said first signal transmission path in series with said trap filter means and said FM multiplexer for passing selected ones of said composite signals having frequencies below a predetermined value.

3. An interference reduction circuit in accordance with claim 1 wherein said trap filter means is adjustable with respect to the degree of attenuation of said pilot signal passing therethrough.

4. An interference reduction circuit in accordance with claim 2 further comprising a bandpass filter means disposed in a third signal transmission path, said third signal transmission path being connected in parallel with said trap filter means and said gate circuit means.

5. An interference reduction circuit in accordance with claim 2 wherein said first and said second signal transmission paths originate at a common point, said common point being the output terminal of said low pass filter means.

6. An interference reduction circuit in accordance with claim 1 or 4 wherein said control means comprises: a control signal transmission path, said control signal transmission path originating at the input terminal of said low pass filter means and including a high pass filter means, an amplifier connected to the output terminal of said high pass filter means, a pulse converter means connected to the output terminal of said amplifier for inverting said interference signals passing through said high pass filter means and flip-flop means coupled to the output terminal of said pulse converter means, the output terminal of said flip-flop means being coupled to said gate circuit means thereby sensing the presence of said interference signals and blocking the passage of said interference signals through said gate circuit means.

* * * * *